United States Patent [19]

Luttmann et al.

[11] 4,322,681

[45] Mar. 30, 1982

[54] MODULE FOR ANALYZING AND LINEARIZING OF ELECTRICAL SIGNALS FROM UNKNOWN SYSTEMS AND METHOD FOR USING IT

[76] Inventors: Alwin Luttmann, Wieste 24, 4476 Werlte; Andreas Plaas-Link, Hardenbergstr. 47, 5900 Siegen; Klaus Mückenhoff, Gartenweg 5, 4600 Dortmund, all of Fed. Rep. of Germany

[21] Appl. No.: 115,669

[22] Filed: Jan. 28, 1980

Related U.S. Application Data

[63] Continuation of Ser. No. 880,199, Feb. 22, 1980, abandoned.

[30] Foreign Application Priority Data

Feb. 22, 1977 [DE] Fed. Rep. of Germany ....... 2707575

[51] Int. Cl.³ .............................................. G01R 23/16
[52] U.S. Cl. ..................... 324/77 D; 330/85; 330/107; 330/108
[58] Field of Search .............. 324/78 F, 83 R, 83 FE, 324/123 R, 123 C, 124, 77 D, 77 E, 77 F; 330/103, 107, 109, 85

[56] References Cited

U.S. PATENT DOCUMENTS

| | | | |
|---|---|---|---|
| 2,281,238 | 4/1942 | Greenwood | 330/103 |
| 3,263,177 | 7/1966 | Durrett | 330/103 |
| 3,987,370 | 10/1976 | Schutz | 330/85 |
| 4,009,400 | 2/1977 | Harris | 330/107 |
| 4,147,990 | 4/1979 | Dokus | 330/85 |
| 4,156,853 | 5/1979 | Peterson | 330/108 |

*Primary Examiner*—Michael J. Tokar
*Attorney, Agent, or Firm*—Michael J. Striker

[57] ABSTRACT

A device for analyzing and linearizing the frequency characteristics of electrical signals from unknown systems consists of identically constructed modules with variable transfer functions, which transfer functions are to be adjusted to a inverse component of the electrical signal to be analyzed. A procedure is disclosed in which the time constant and variable gain of each module is independently adjusted, whereby the variable gains and the time constants define the poles and the zeros of a polynomial, which polynomial describes the frequency characteristics of the unknown system.

6 Claims, 1 Drawing Figure

MODULE FOR ANALYZING AND LINEARIZING OF ELECTRICAL SIGNALS FROM UNKNOWN SYSTEMS AND METHOD FOR USING IT

This is a continuation of application Ser. No. 880,199, filed Feb. 22, 1980, now abandoned.

BACKGROUND OF THE INVENTION

The present invention relates to a module for analyzing and linearizing electrical signals, and to a method for using it.

In order to analyze and linearize unknown measuring systems and physical, chemical or biological system it is first necessary to identify their frequency characteristics in order to linearize them.

It is known to use the differential equation governing the system in question to calculate its frequency characteristics, or to compare measured time functions of the system with well known time functions by means of approximation techniques. Either process requires knowledge of the processes themselves and a mathematical calculation by computer (Isermann, *Experimentelle Analyse der Dynamik von Regelsystemen*, Identifikation I, Mannheim 1971).

SUMMARY OF INVENTION

It is therefore an object of the present invention to enable a user to analyze and linearize the frequency characteristics of unknown systems in a simple manner without any knowledge about the underlying physical or chemical processes which govern the systems themselves and to do so simply and inexpensively. Additionally it should be possible to analyze and linearize systems with very complicated frequency characteristics.

With these and other objects in view, this invention utilizes identically constructed modules, all connected in series with each other and each having a proportional differential transfer function with a first order time delay. The differential transfer function of each module is adjusted to be inverse to a component of the system with the frequency characteristics to be analyzed. Each module is composed of an amplifier which is connected to a first feedback network with a variable gain and is also connected to a second feedback network with a variable first order time delay. At first, the variable gain of the first module is set to zero and the time delay of the first module is adjusted so that the output signal from the first module approaches an electrical signal with a known time function at a maximum rate. Then, the variable gain of the first module is adjusted so that once again, the output signal from the first module approaches the electrical signal with the known time function at a maximum rate. The following modules, are connected in series, and the output signal from the thus adjusted module is used as an input signal to the chain of remaining modules. This process is then repeated, module by module, for each module which is next in line in the chain. By adjusting the modules in this fashion, the gains and the variable time delays are fixed. The overall differential transfer function of the entire chain of modules will thus to define the frequency characteristics of the system to be analyzed, and can be expressed as a product of linear factors in a polynomial, each factor having a numerator and a denominator. The poles of the polynomial are defined by the time delays and the zeros of the polynomial are defined by the product of the gains and the time delays of each module.

It is advantageous to first determine the larger time functions in the system's frequency characteristics and then to determine the smaller ones stepwise in subsequent modules. During this process, the overall output signal becomes more and more similar to the electrical signal with the known time function which the output signals are adjusted to approximate. It is easy to analyze system components with very small time because the influence of the longer ones in the system has already been eliminated by adjustment of prior modules. An advantage of this invention is that the modules are identically constructed, and are connected in series, and adjustment is simple and identical for each module. The production of the modules can therefore be standardized and the stepwise analysis can be done automatically.

To analyze the frequency characteristics of measurement systems it is advantageous to apply a test signal with a known time function to the measurement system and to analyze the resulting electrical signal.

To simplify the adjustment of each module the overall amplification of each module is kept constant. The gains of the first and second feedback networks in each module are linked by using a dual-wiper potentiometer, so that, during adjustment of each module, the sum of the gains is kept constant.

To determine the parameters of the frequency characteristics of the electrical signal under test, the gains and the time delays are adjusted by using potentiometers and switches, whereby the gains and the time delays are fixed and the poles and the zeros of the above-mentioned polynomial can thereby be known.

Since the adjustment procedure is always the same, adjustment of the gains and time delays can be performed automatically by use of analog or digital computers or microprocessors.

If adjusted modules are connected in series with a system with an nonlinear transfer function, this series chain can be used for linearisation of all systems having the same transfer function as the analyzed system.

In order to analyze unrepeatable processes the electrical signal to be analyzed, is recorded on, e.g., a tape recorder and periodically reanalyzed.

In order to completely analyze the frequency characteristics of electrical signals with a series chain having a smaller number of modules it is necessary to use the modules repeatedly by recording the particular analyzed and linearized electrical signal and reapplying it to the same module.

Figure 1:
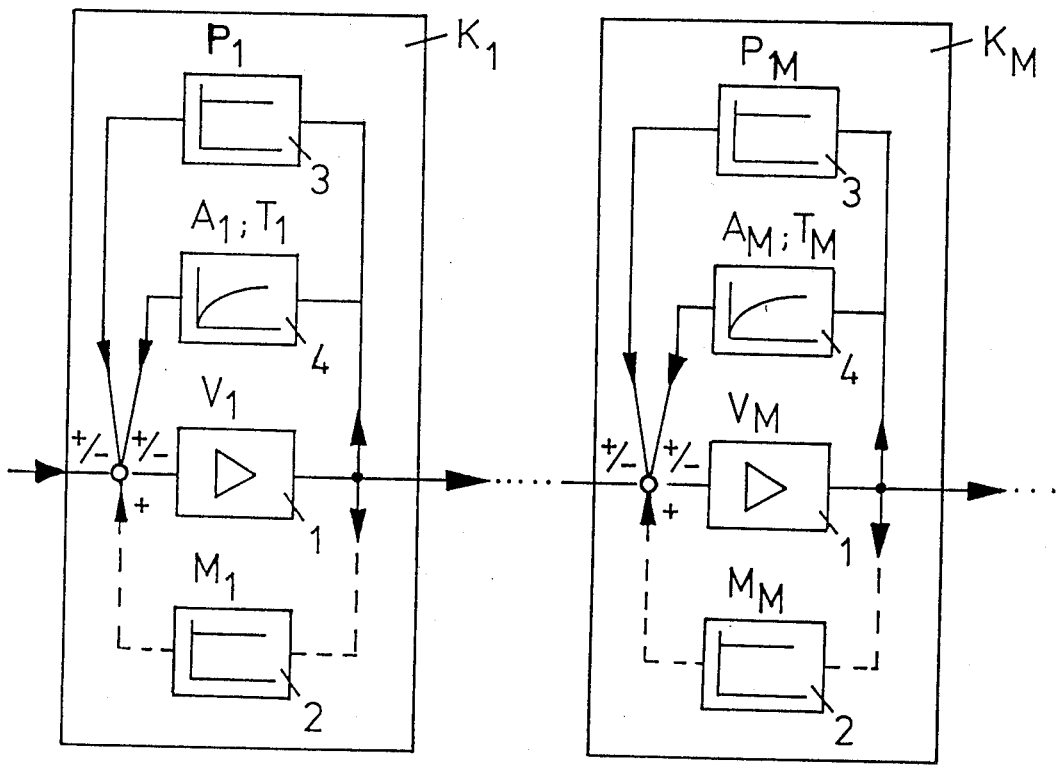
FIG. 1 shows the construction of the chain of modules here disclosed.

The modules $K_1$ to $K_M$ are connected in series. Each module contains of gain 1 with an amplification $V_M$, a first feedback network 3 with gain $P_M$ and a second feedback network 4 with order gain $A_M$ and a first order delay time $T_M$. Optionally, each module contains a positive feedback network 2 with gain $M_M$ such that the product of $V_M$ and $M_M$ is approximately one, or amplifier 1 has a gain $V_M$ which is very high as compared to gain $P_M$ and $A_M$. The time delays $T_M$ can be realized by RC sections, and adjusted by variable resistances. The transfer function of a module $K_M$ is:

$$F_u = \cfrac{1}{P_M + \cfrac{A_M}{1+sT_M}} = \frac{1+sT_M}{A_M + P_M + sT_M P_M}$$

with $s = j\omega$.

To keep the overall gain of each module constant during adjustment, the sum of gains $A_M$ and $P_M$ is held constant by using a dual-wiper potentiometer:

$$A_M + P_M = 1$$

so that, by substitution $$F_u = \frac{1+sT_M}{1+sT_M P_M}$$

The series connection of the modules yields the polynomial:

$$F_s = \frac{1+sT_1}{1+sT_1 P_1} \cdot \frac{1+sT_2}{1+sT_2 P_2} \cdots \frac{1+sT_M}{1+sT_M P_M}$$

After adjustment, $F_s$ is inverse to the frequency characteristics of the incoming electrical signal from the system under analysis, so that the time delay $T_M$ of each module defines a pole of the polynomial and the product of gain $P_M$ and time delay $T_M$ defines the zero of the polynomial.

We claim:

1. A module adapted for use with others of like kind in a series chain in order to analyze and linearize frequency characteristics of unknown systems, comprising:

an amplifier with an input and an output;

a first feedback network with a variable gain, the first feedback network being connected between the input and the output; and a second feedback network with a variable first order time delay, the second feedback network being connected between the input and the output.

2. The module defined by claim 1, further including a positive feedback network with a fixed gain, the positive feedback network being connected between the input and the output.

3. The module defined by claim 2, wherein the amplifier has a fixed gain V and wherein the positive feedback network has a fixed gain M, and wherein fixed gain V and fixed gain M satisfy a relationship in which $$V \times M = 1.$$

4. The module defined by claim 1, wherein the amplifier has a fixed gain V, wherein the first feedback network has a variable gain P, and wherein the second feedback network has a gain A, and wherein fixed gain V, variable gain P and fixed gain A satisfy the mathematical relationships in which $$V \gg P$$

and $$V \gg A.$$

5. The module defined by claim 1, wherein the first feedback network has a variable gain P and wherein the second feedback network has a gain A, and wherein the module further includes a means linking the first and second feedback networks in a manner that variation of variable gain P with gain A is constrained to satisfy a mathematical relationship in which $$P + A = 1.$$

6. The module defined by claim 5, wherein the means is a dual-wiper potentiometer.

* * * * *